United States Patent [19]
Sasaki

[11] Patent Number: 5,498,574
[45] Date of Patent: Mar. 12, 1996

[54] PROCESS OF FABRICATING SEMICONDUCTOR DEVICE HAVING FLATTENING STAGE FOR INTER-LEVEL INSULATING LAYER WITHOUT DETERIORATION OF DEVICE CHARACTERISTICS

[75] Inventor: Shuuzou Sasaki, Tokyo, Japan

[73] Assignee: NEC Corporation, Tokyo, Japan

[21] Appl. No.: 427,216

[22] Filed: Apr. 24, 1995

[30] Foreign Application Priority Data

Apr. 22, 1994 [JP] Japan ..................... 6-084228

[51] Int. Cl.⁶ ............................................ H01L 21/302
[52] U.S. Cl. ..................... 437/195; 437/228; 437/978; 156/636.1
[58] Field of Search ..................... 437/195, 228, 437/978; 156/636, 653.1, 636.1; 134/3

[56] References Cited

U.S. PATENT DOCUMENTS

| | | | |
|---|---|---|---|
| 4,116,714 | 9/1978 | Basi | 134/3 |
| 4,377,438 | 3/1983 | Moriya et al. | 156/643 |
| 5,272,117 | 12/1993 | Roth et al. | 437/228 |
| 5,356,513 | 10/1994 | Burke et al. | 156/636 |
| 5,389,194 | 2/1995 | Rostoker et al. | 156/636 |
| 5,395,801 | 3/1995 | Doan et al. | 437/225 |
| 5,399,533 | 3/1995 | Pramanik et al. | 437/228 |

FOREIGN PATENT DOCUMENTS

| | | |
|---|---|---|
| 1-216537 | 8/1989 | Japan . |
| 4-155927 | 5/1992 | Japan . |
| 5-226334 | 9/1993 | Japan . |
| 6-45313 | 2/1994 | Japan . |

OTHER PUBLICATIONS

Wolf, S., et al., Silicon Processing, Lattice press, 1986, pp. 514–520, 547–556.

Primary Examiner—T. N. Quach
Attorney, Agent, or Firm—Foley & Lardner

[57] ABSTRACT

An upper portion of a silicon nitride layer deposited over a silicon oxide layer which in turn covers metal wirings is partially polished for forming a flat surface remaining silicon nitride layer prevents the metal wirings from a strong, corrosive cleaning solution during a cleaning stage of residual oxide particles and contaminant, and the remaining silicon nitride layer and a part of the silicon oxide layer are uniformly etched by dry etchant so as to decrease a parasitic capacitance coupled to the metal wirings.

11 Claims, 10 Drawing Sheets

PROCESS OF FABRICATING SEMICONDUCTOR DEVICE HAVING FLATTENING STAGE FOR INTER-LEVEL INSULATING LAYER WITHOUT DETERIORATION OF DEVICE CHARACTERISTICS

FIELD OF THE INVENTION

This invention relates to a process of fabricating a semiconductor device and, more particularly, to a process of fabricating a semiconductor device having a flattening stage for an inter-level insulating layer.

DESCRIPTION OF THE RELATED ART

As chip functionality has grown, intra-chip wiring complexity has also grown, and most of the large scale integration transfers internal signals through a multi-level wiring structure. Wiring are patterned on an inter-level insulating layer, and the wiring pattern and the inter-level insulating layer are repeatedly laminated over the semiconductor substrate so as to complete the multi-level wiring structure.

While an inter-level insulating layer is being formed on a lower wiring pattern, the topography of the wiring pattern is transferred to the inter-level insulating layer, and an upper wiring pattern topographically extends on the inter-level insulating layer. If the step-coverage of the inter-level insulating layer is poor, the upper wiring pattern becomes thin at the steps, and is liable to be disconnected due to, for example, the electro-migration.

For this reason, the manufacturer has tried to improve the step-coverage, and a reflow technique at 900 degrees to 1100 degrees centigrade is well known. However, the reflow can imperfectly flatten the surface of the inter-level insulating layer, and the disconnection still takes place. If the multi-level insulating layer structure increases the number of wiring levels, the disconnection in an upper-level wiring pattern is serious, and the reflow technique comes up against a wall.

Japanese Patent Publication of Unexamined Application No. 1-216537 discloses a mechanical polishing which improves the surface flatness of an inter-level insulating layer.

FIGS. 1A to 1D illustrate the prior art process sequence including the mechanical polishing disclosed in the Japanese Patent Publication of Unexamined Application. The prior art process starts with preparation of a semiconductor substrate 1, and a gate oxide layer 2 is grown on the major surface of the semiconductor substrate 1. Polysilicon is deposited over the gate oxide layer 2, and is patterned into polysilicon gate electrodes 3a and 3b.

Subsequently, silicon oxide is deposited over the entire surface of the structure to 1 micron thick by using a chemical vapor deposition technique, and a lower silicon oxide layer 4a covers the gate oxide layer 2 and the polysilicon gate electrodes 3a and 3b. Although the pattern of the gate electrodes 3a/3b is transferred to the lower silicon oxide layer 4a, the step-coverage is slightly improved through the reflow. However, the upper surface of the lower silicon oxide layer 4a is still convex.

After the reflow, the silicon oxide is deposited over the lower silicon oxide layer 4a to 2 microns thick by using the chemical vapor deposition, and an upper silicon oxide layer 4b covers the lower silicon oxide layer 4a. The convex surface of the lower silicon oxide layer 4a is transferred to the upper surface of the upper silicon oxide layer 4b, and the upper silicon oxide layer 4b also has a convex surface. The upper silicon oxide layer 4b is also subjected to the reflow, and the resultant structure is shown in FIG. 1A.

The structure shown in FIG. 1A is placed in a grinding apparatus (not shown), and a rotating grinding cutter (not shown) of the grinding apparatus grinds the upper silicon oxide layer 4b by 1.5 microns. The upper silicon oxide layer 4b fills the valleys of the lower silicon oxide layer 4a, and the upper surface of the upper silicon oxide layer 4b is perfectly flattened as shown in FIG. 1B. The lower silicon oxide layer 4a and the upper silicon oxide layer 4b form in combination a first inter-level insulating layer structure 4.

Conductive metal such as aluminum is deposited over the entire surface of the structure, and the aluminum layer is patterned into metal wirings 5 as shown in FIG. 1C.

Silicon oxide is deposited over the entire surface of the structure by the chemical vapor deposition, and a lower silicon oxide layer 6a covers the aluminum wirings 5. The metal wiring pattern is transferred to the lower silicon oxide layer 6a.

The silicon oxide is deposited on the lower silicon oxide layer 6a through the chemical vapor deposition again, and an upper silicon oxide layer 6b covers the lower silicon oxide layer 6a. Then, the rotating grinding cutter flattens the upper silicon oxide layer 6b, and Residual oxide particles and contaminant are removed in the cleaning solution, i.e., 2% hydrogen fluoride. The lower and upper silicon oxide layers 6a and 6b form in combination a second inter-level insulating layer structure 6.

Thus, the upper silicon oxide layers 4b and 6b are Residual oxide so as to obtain the flat surfaces of the first and second inter-level layer structures 4 and 6, and the conductive wirings 5 are free from the disconnections due to poor step-coverage.

However, the prior art process encounters a problem in that the contaminant remains after the cleaning stages, and circuit components are deteriorated due to the remaining contaminant.

The cleaning solution of 2% hydrogen fluoride is weak in detergency, and imperfectly removes the Residual oxide particles and the contaminant.

If the manufacturer washes the upper silicon oxide layers 4b and 6b in a strong cleaning solution such as high-temperature dilute ammonium hydroxide or dilute sulfuric acid, the Residual oxide particles and the contaminant are perfectly removed from the upper silicon oxide layers 4a and 6a. However, the aluminum wirings 5 are corroded by the strong cleaning solution, because the silicon oxide deposited through the chemical vapor deposition is porous. The porous silicon oxide layer allows the strong cleaning solution to permeate, and the strong cleaning solution reaches the aluminum wirings 5. The strong cleaning solution corrodes the aluminum wirings 5, and disconnects the wirings 5.

If a silicon nitride layer deposited through a plasma-assisted chemical vapor deposition is inserted between the aluminum wirings 5 and the second inter-level insulating layer structure 6, the silicon nitride layer prevents the aluminum wirings 5 from the strong cleaning solution, and the semiconductor device are free from the contamination and the corrosion. However, the silicon nitride is large in dielectric constant, and, for this reason, a large parasitic capacitance is coupled to the aluminum wirings 5. As a result, the aluminum wirings can not propagates electric signals at high speed.

SUMMARY OF THE INVENTION

It is therefore an important object of the present invention to provide a process of fabricating a semiconductor device which flattens an inter-level insulating layer structure without contamination, corrosion and deterioration of device characteristics.

To accomplish the object, the present invention proposes to block lower wiring layers from corrosive etchant by using a silicon nitride layer to be removed after a patterning stage of lower wirings.

In accordance with the present invention, there is provided a process of fabricating a semiconductor device comprising the steps of: a) preparing a semiconductor substrate having an insulating layer; b) patterning a conductive layer into at least one conductive wiring extending on the insulating layer; c) forming a multi-layer insulating film structure having a first silicon oxide layer on the at least one conductive wiring and the insulating layer and a silicon nitride layer on the first silicon oxide layer; d) grinding an exposed surface portion of the multi-layer insulating film structure in such a manner as to leave a part of the silicon nitride layer in the multi-layer insulating film structure, thereby creating a flat surface of the multi-layer insulating film structure; e) cleaning the flat surface by using a cleaner corrosive against the conductive layer; f) uniformly etching an exposed portion of the multi-layer insulating film structure by using under etching conditions having a selectivity equal between silicon oxide and silicon nitride for removing the silicon nitride layer; and g) forming upper wirings on an exposed flat surface of the silicon oxide layer.

The silicon nitride layer may be overlain by a silicon oxide layer.

BRIEF DESCRIPTION OF THE DRAWINGS

The features and advantages of the process of fabricating a semiconductor device according to the present invention will be more clearly understood from the following description taken in conjunction with the accompanying drawings in which.

DESCRIPTION OF THE PREFERRED EMBODIMENTS

First Embodiment

Figure 1A:
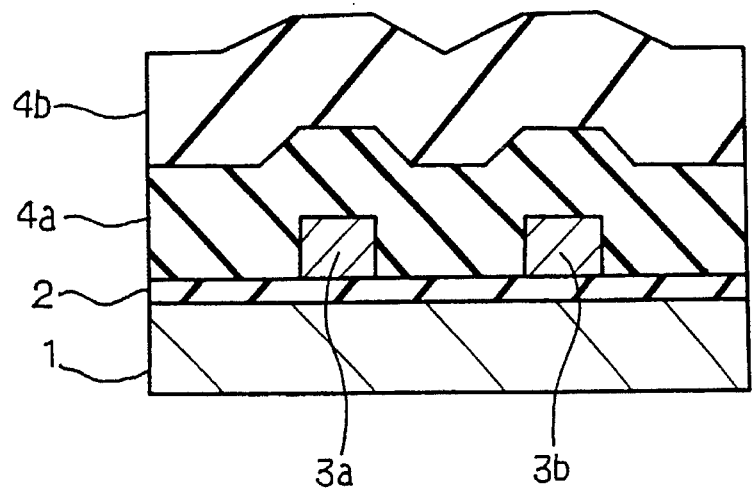
FIGS. 1A to 1D are cross sectional views showing the prior art process sequence for fabricating a semiconductor device.
Figure 1B:
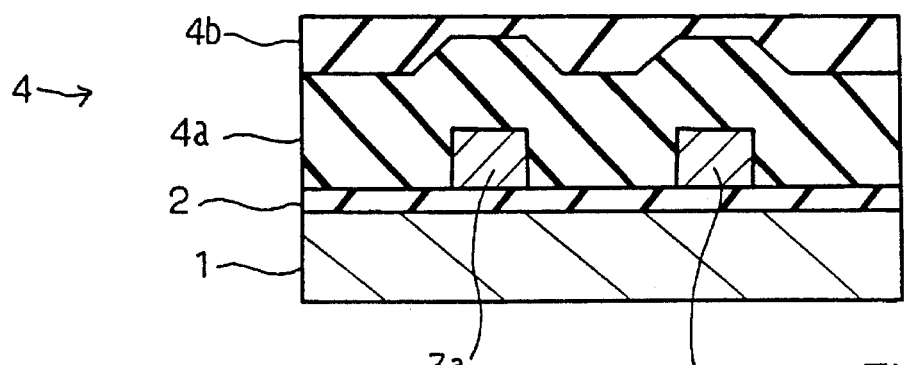
Figure 1C:
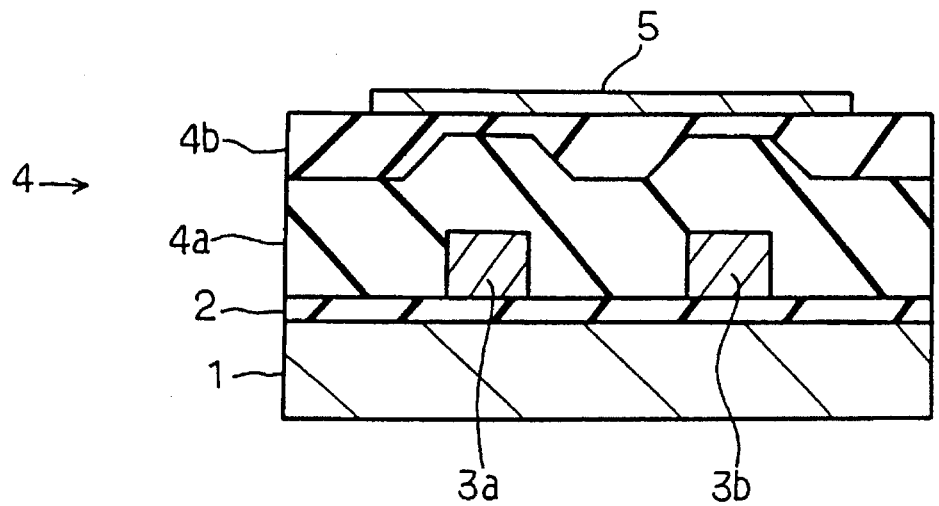
Figure 1D:
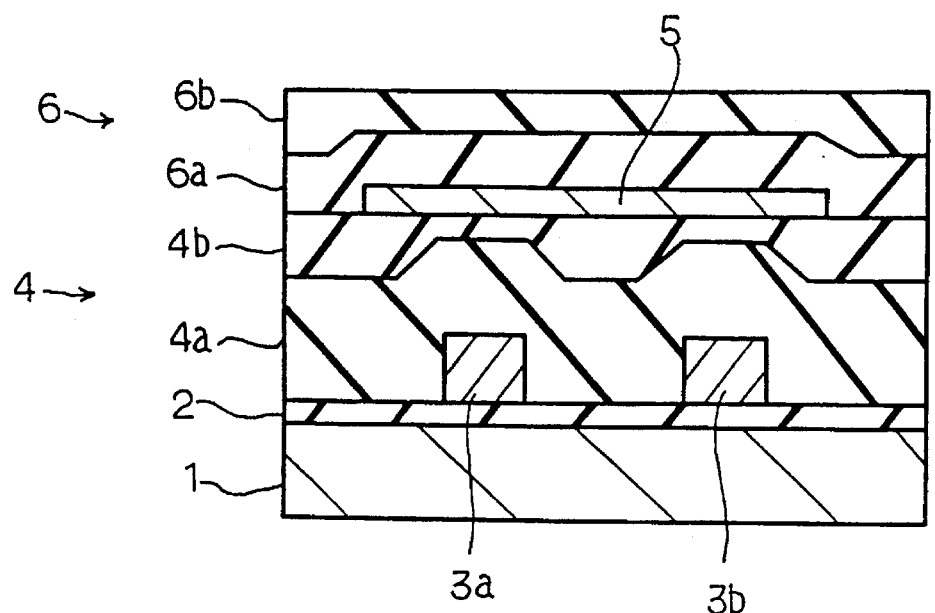

Referring to FIGS. 2A to 2H of the drawings, a process of fabricating a semiconductor device starts with preparation of a silicon substrate 11. A gate insulating layer 12 of silicon oxide is thermally grown on active areas of the silicon substrate 11, and gate electrodes 13a and 13b of aluminum or aluminum alloy are patterned on the gate insulating layer 12. The gate electrodes 13a and 13b are about 1 micron thick. Though not shown in the drawings, source and drain regions are formed in the active regions in a self-aligned manner with the gate electrodes 13a and 13b, and field effect transistors are fabricated on the silicon substrate 11.

Silicon oxide is deposited to thickness of 2.5 microns over the entire surface of the structure by using a plasma-assisted chemical vapor deposition technique, and a silicon oxide layer 13c covers the exposed portion of the gate insulating layer 12 and the gate electrodes 13a and 13b. The convex surface due to the gate electrodes 13a and 13b is transferred to the silicon oxide layer 13c.

Figure 2A:
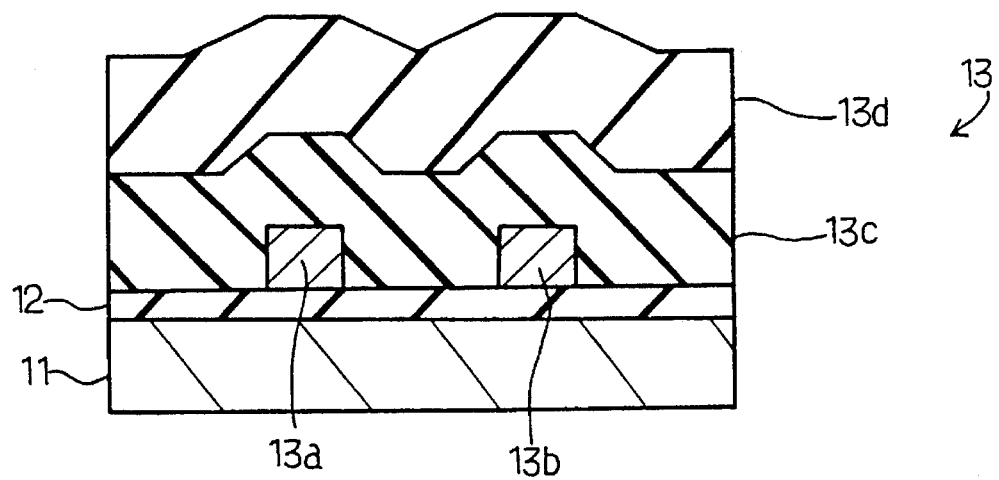
FIGS. 2A to 2H are cross sectional views showing a process sequence for fabricating a semiconductor device according to the present invention.

Silicon nitride is deposited over the silicon oxide layer 13c to thickness of 2 microns by using a plasma-assisted chemical vapor deposition technique, and a silicon nitride layer 13d covers the silicon oxide layer 13c. The convex surface is further transferred to the silicon nitride layer 13d, and the silicon oxide layer 13c and the silicon nitride layer 13d form in combination an inter-level insulating film structure 13. The resultant structure is illustrated in FIG. 2A.

Subsequently, a flat surface is created on the inter-level insulating film structure 13 through a mechanical polishing technique or a mechanical and chemical polishing technique. A polishing slurry such as a slurry containing micro silica particles is supplied to the polished surface of the inter-level insulating film structure 13 during the mechanical and chemical polishing.

Figure 2B:
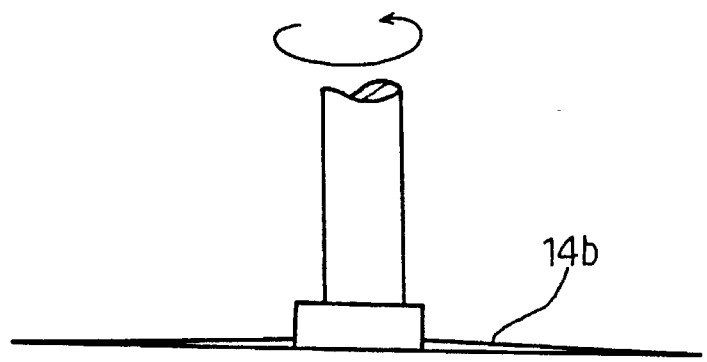
Figure 2B:
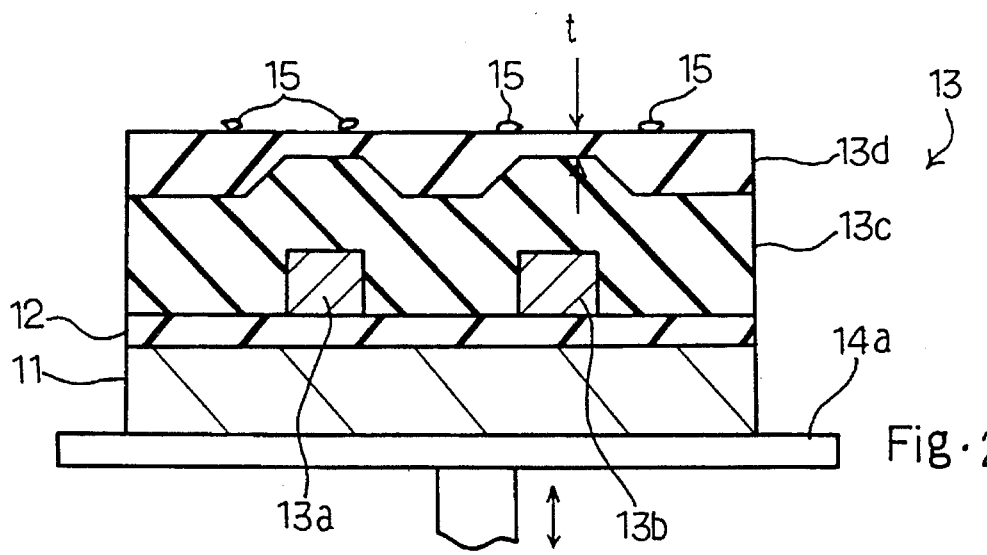
Figure 2C:
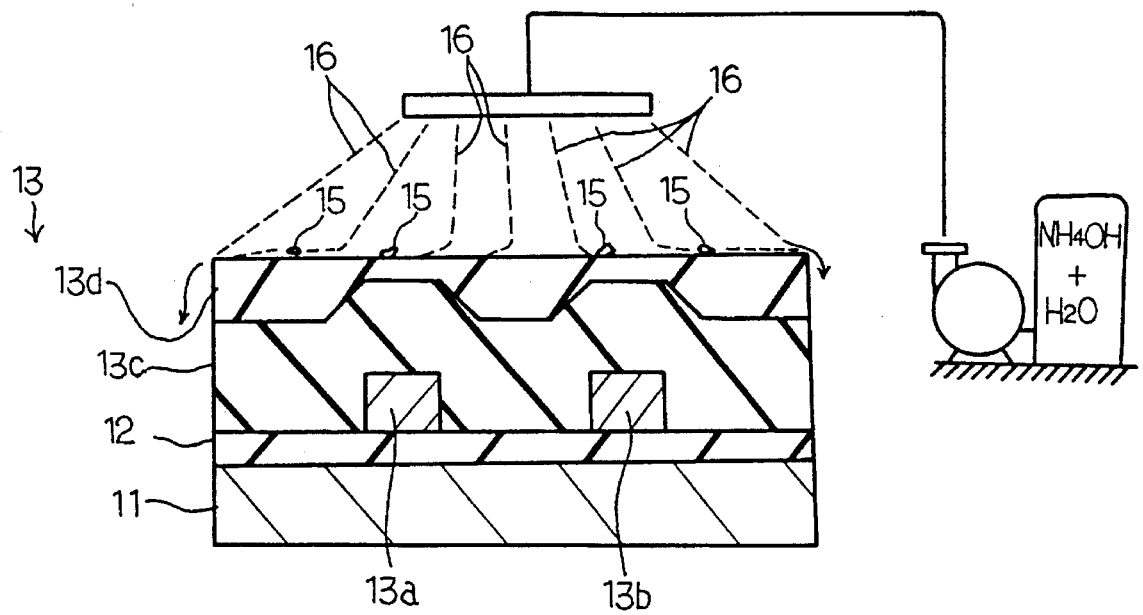

In detail, the silicon substrate 11 is placed on a lifting table 14a under a rotational cutter 14b, and the lifting table 14a brings the surface portion of the silicon nitride layer 13d into contact with the rotating cutter 14b. The rotational cutter 14b grinds the surface portion of the silicon nitride layer, and the polishing is finished when the minimum remaining thickness t of the silicon nitride layer 13d reaches 200 nanometers as shown in FIG. 2B. In other words, the silicon nitride layer 13d is polished or Residual oxide by 1.8 microns. Residual oxide particles and contaminants 15 are left on the flat surface of the silicon nitride layer 13d.

Subsequently, the silicon substrate 11 is placed in a cleaning room, and cleaner 16 is sprayed to the flat surface of the silicon nitride layer 13d, and the particles/contaminants 15 are washed away. In this instance, dilute ammonium hydroxide or dilute sulfuric acid is used for the cleaning.

Although the dilute ammonium hydroxide and the dilute sulfuric acid are corrosive against the aluminum or the aluminum alloy, the high-dense silicon nitride layer 13d prevents the gate electrodes 13a and 13b from the corrosive acid. The particles and contaminants 15 are perfectly washed away in the cleaning solution 16. As a result, the particles and contaminants 15 do not deteriorate device characteristics.

The silicon substrate 11 is placed in a reactor 17 of a parallel plate reactive etching system, and an etch-back is carried out. A selectivity of the reactive ion etching is equal between the silicon oxide and the silicon nitride, and the inter-level insulating film structure 13 is uniformly etched away until a flat surface 13e is created on the silicon oxide layer 13c.

The etching conditions achieving the equal selectivity are as follows. The flow ratio between $CHF_3$ and $O_2$ are regulated to 2:1–10:1, and the gaseous mixture of $CHF_3$ and $O_2$ is introduced into the reactor 17 as an etchant. The gas pressure is regulated to about 10 Pa, and radio frequency power is regulated to about 1000 watts. Under these etching conditions, both of the silicon nitride and the silicon oxide are equally etched away at 40 to 60 nanometer/minute.

Figure 2D:
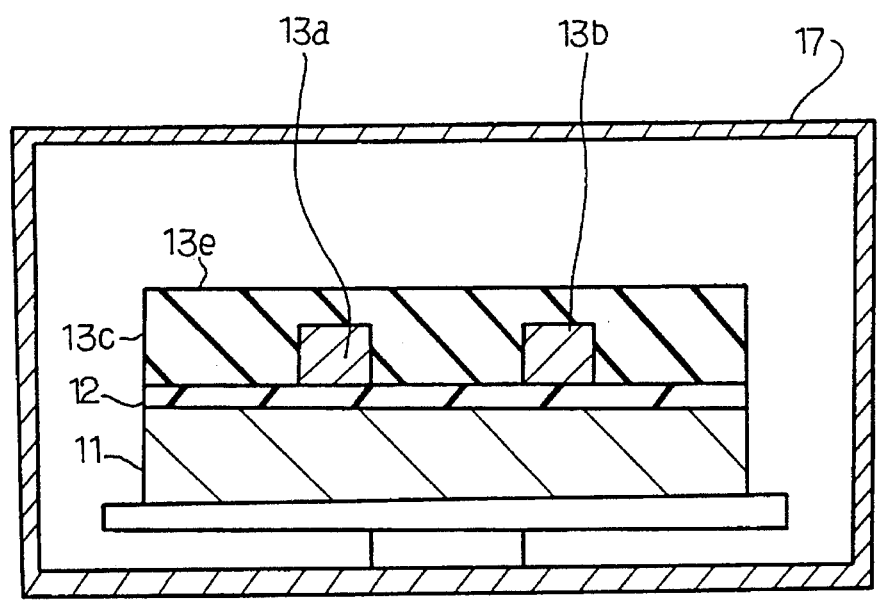

Thus, the silicon nitride layer 13d is perfectly removed from the structure, and only the silicon oxide layer 13c is left over the gate electrodes 13a and 13b as shown in FIG. 2D. The etch-back technique transfers the flat surface of the silicon nitride layer 13d to the silicon oxide layer 13c.

Figure 2E:
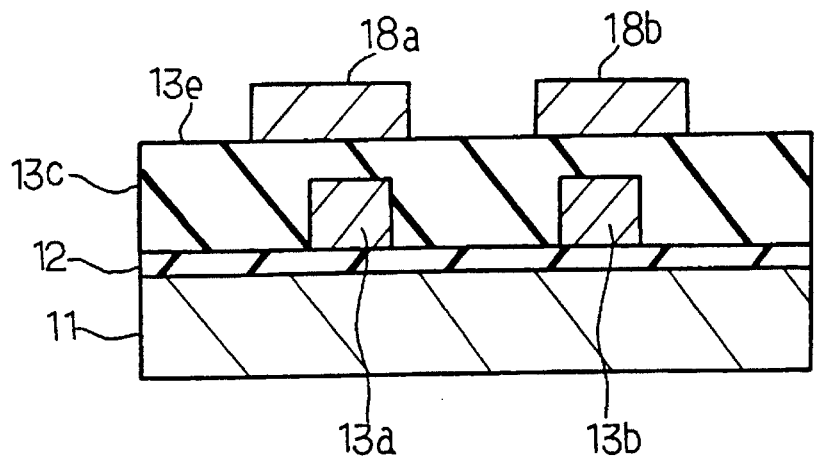

Aluminum is deposited over the entire surface of the structure, and the aluminum layer is patterned into upper wirings 18a and 18b as shown in FIG. 2E. The upper wirings 18a and 18b are free from a disconnection due to poor step-coverage, because the silicon oxide layer 13c provides the flat surface 13e. Although the silicon oxide layer 13c between the lower wirings 13a/13b and the upper wirings 18a/18b serves as a dielectric film of a parasitic capacitor, the parasitic capacitance is rather small than that with a silicon nitride layer.

Figure 2F:
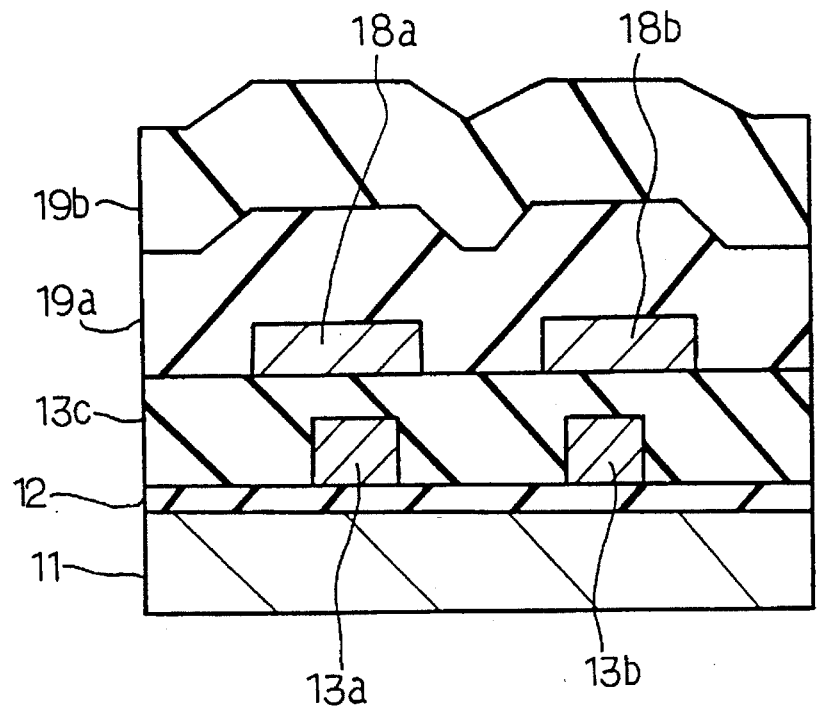

The plasma-depositions are carried out again, and a silicon oxide layer 19a and a silicon nitride layer 19b are laminated over the upper wirings 18a and 18b as shown in FIG. 2F.

Figure 2G:
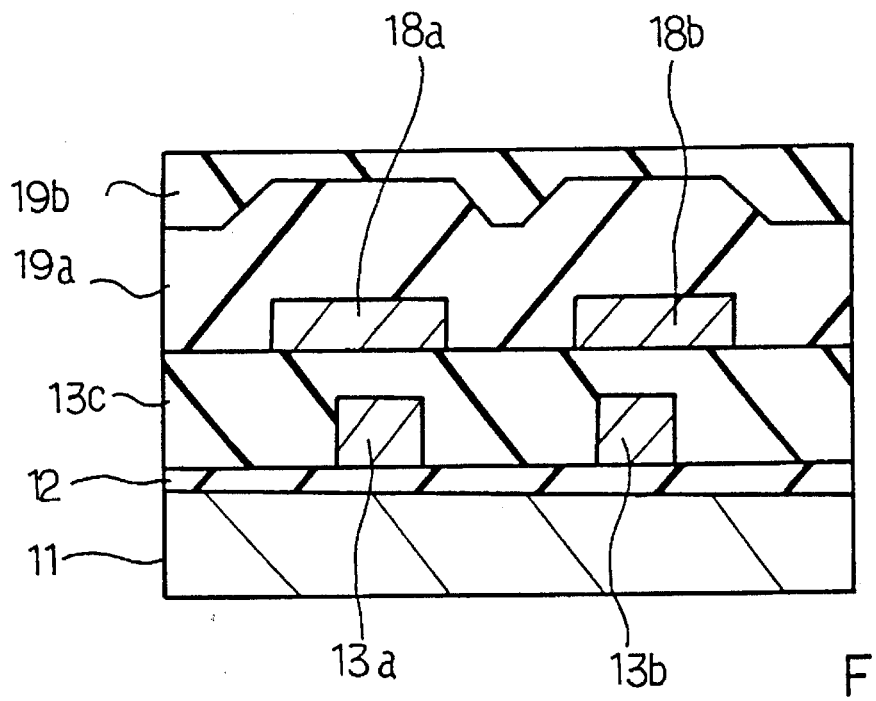

The silicon nitride layer 19b is polished or Residual oxide by the rotational cuter 14b, and particles and contaminants are washed by the cleaning solution 16. The silicon nitride layer 19b prevents the upper wirings 18a and 18b from the corrosive cleaning solution 16. The resultant structure is illustrated in FIG. 2G.

The silicon nitride layer 19b and the silicon oxide layer 19a are uniformly etched away, and a flat surface 19c is created on the silicon oxide layer 19a.

Figure 2H:
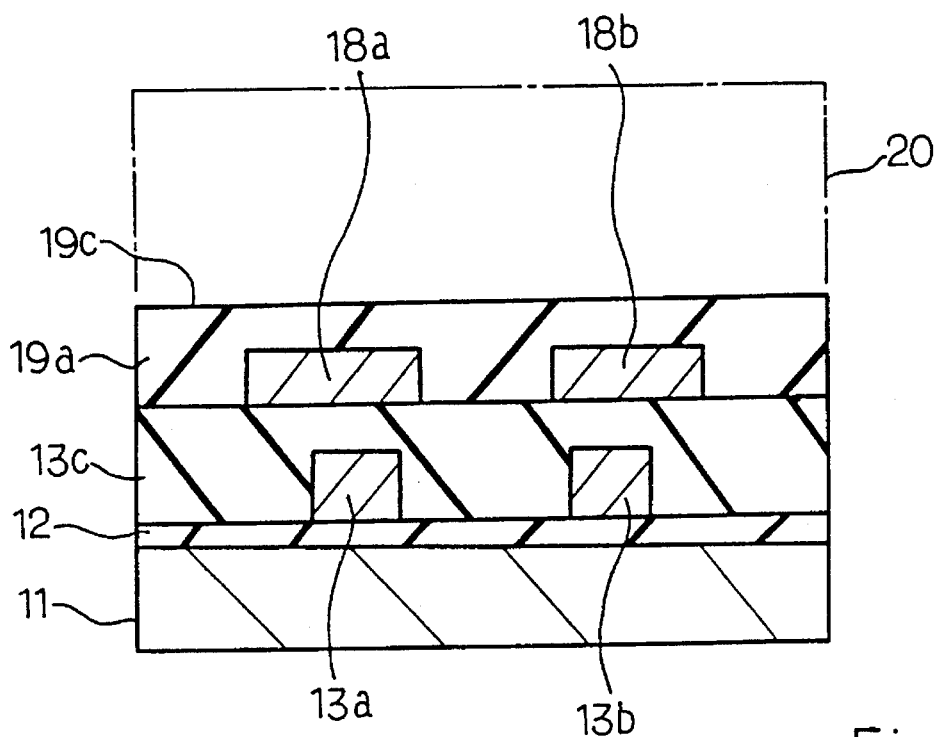

Thus, the flattening stage, i.e., the depositions, the polishing, the cleaning and the etch-back are repeated so that a multi-level wiring structure 20 is fabricated over the silicon substrate 11 as shown in FIG. 2H.

As will be appreciated from the foregoing description, the flattening stage does not leave the particles and contaminants in the multi-level wiring structure 20 without increase of the parasitic capacitance.

Second Embodiment

Turning to FIGS. 3A to 3F of the drawings, another process sequence embodying the present invention starts with preparation of a silicon substrate 31. A gate insulating layer 32 is thermally grown on the major surface of the silicon substrate 31, and gate electrodes 33a and 33b are patterned on the gate insulating layer 32. Source and drain regions (not shown) are formed in the silicon substrate 31, and field effect transistors are completed on the silicon substrate 31.

Figure 3A:
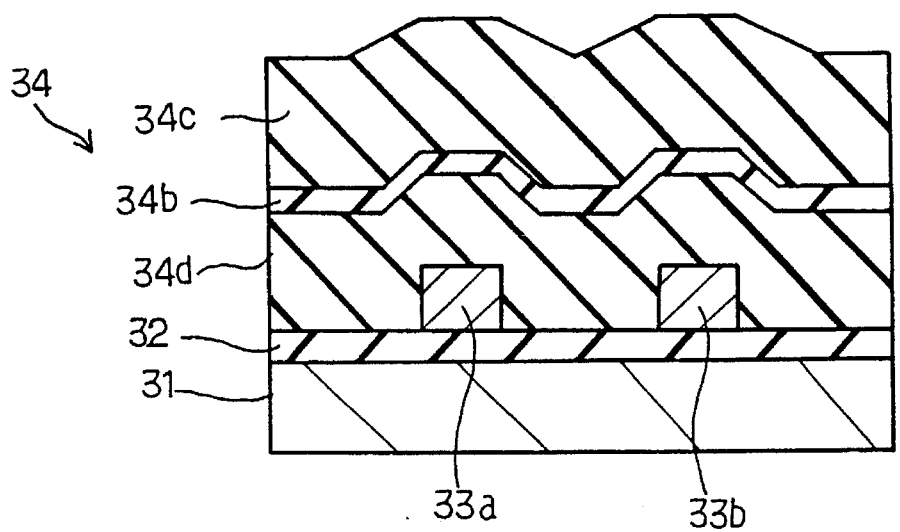
FIGS. 3A to 3F are cross sectional views showing another process sequence for fabricating a semiconductor device according to the present invention.

Silicon oxide is deposited over the gate electrodes 33a and 33b to thickness of 2.5 microns through a plasma-assisted chemical vapor deposition technique, and a silicon oxide layer 34a covers the gate electrodes 33a and 33b. Silicon nitride is deposited over the silicon oxide layer 34a to 300 nanometers by using a plasma-assisted chemical vapor deposition technique, and a silicon nitride layer 34b is laminated on the silicon oxide layer 34a. Silicon oxide is deposited to 2 microns thick through the plasma-assisted chemical vapor deposition again, and a silicon oxide layer 34c is laminated on the silicon nitride layer 34b. The silicon oxide layers 34a and 34c and the silicon nitride layer 34b form in combination an inter-level insulating film structure 34, and convex surface due to the gate electrodes 33a and 33b is transferred through the silicon oxide layer 34a and the silicon nitride layer 34b to the silicon oxide layer 34c as shown in FIG. 3A.

Figure 3B:
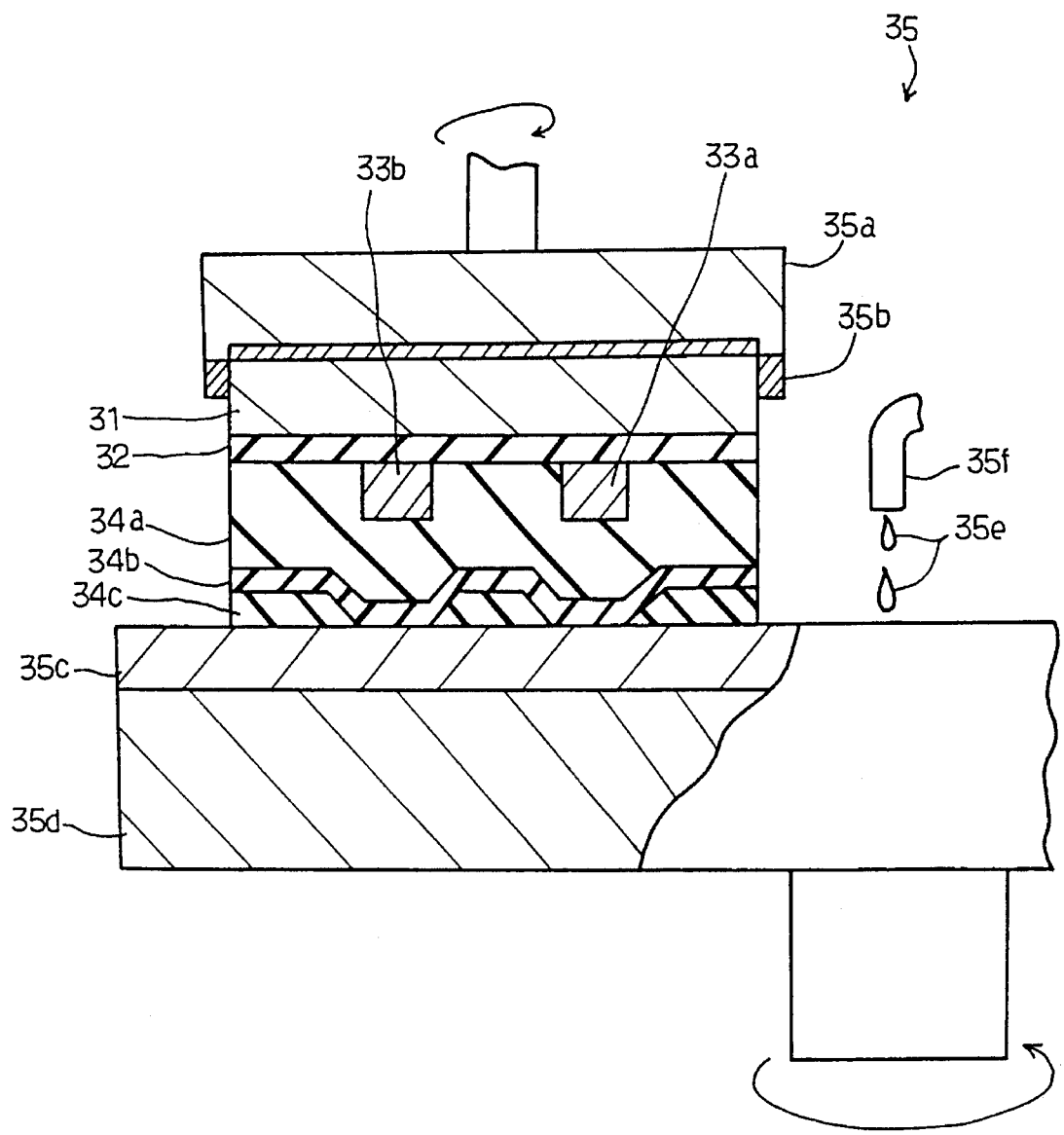

Subsequently, the silicon substrate 31 is subjected to a chemical-mechanical polishing. Namely, the semiconductor substrate 31 is fixed to a rotating plate 35a by means of a retaining ring 35b, and the surface portion of the silicon oxide layer 34c is pressed against a polishing pad 35c fixed to a rotating table 35d as shown in FIG. 3B. The table 35d and, accordingly, the polishing pad 35c are also rotating, and polishing slurry 35e is supplied from a nozzle 35f to the polishing pad 35c. The pressure against the polishing pad 35c ranges from 200 g/cm$^2$ to 500 g/cm$^2$ and the polishing slurry 35e contains micro silica particles. Then, the silicon oxide layer 34c is grinded by 1 micron.

The chemical and mechanical polishing speed on the silicon nitride is a tenth of the chemical and mechanical polishing speed on the silicon oxide, and the silicon nitride layer 34b allows the polishing pad 35c to overrun the time. In other words, the silicon nitride layer 34c serves as a polishing stopper, and a silicon nitride layer not less than 200 nanometers thick is sufficient for the polishing stopper. For this reason, the time control is easier than the first embodiment. Moreover, the silicon oxide layer 34c is Residual oxide at high speed, and the time consumed in the grinding is shorter than that of the first embodiment.

Figure 3C:
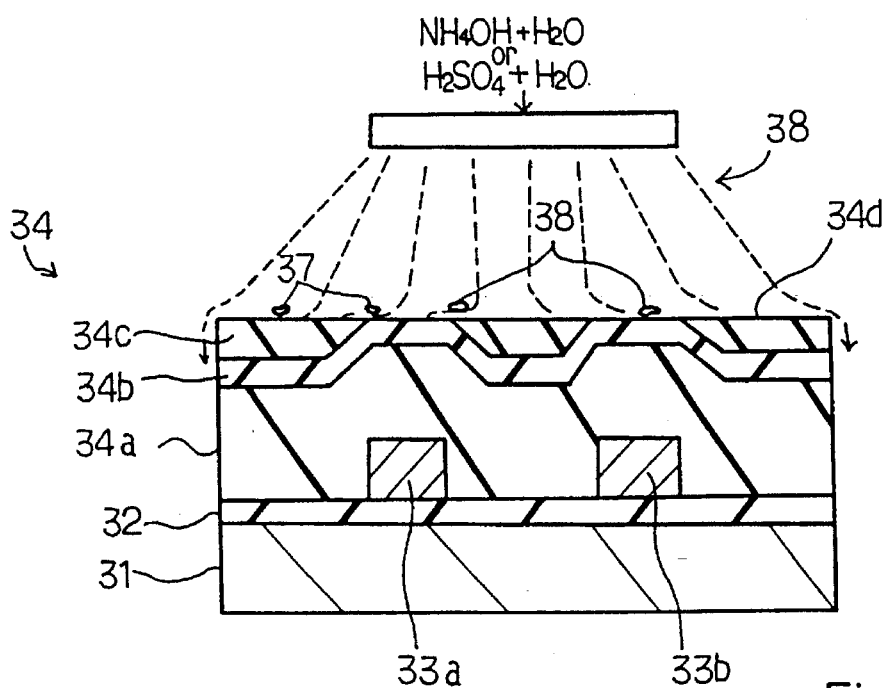

Residual oxide particles and contaminants 37 are left on a flat surface 34d formed by parts of the silicon nitride layer 34b and remaining portions of the silicon oxide layer 34c (see FIG. 3C).

Subsequently, the silicon substrate 31 is placed in a cleaning room, and cleaner 38 is sprayed to the flat surface 34d, and the particles/contaminants 37 are washed away. In this instance, the dilute ammonium hydroxide or the dilute sulfuric acid is used for the cleaning.

Although the dilute ammonium hydroxide and the dilute sulfuric acid are corrosive against the aluminum or the aluminum alloy, the high-dense silicon nitride layer 34b prevents the gate electrodes 33a and 33b from the corrosive acid. The particles and contaminants 37 are perfectly washed away in the cleaning solution 38. As a result, the particles and contaminants 37 do not deteriorate device characteristics.

Figure 3D:
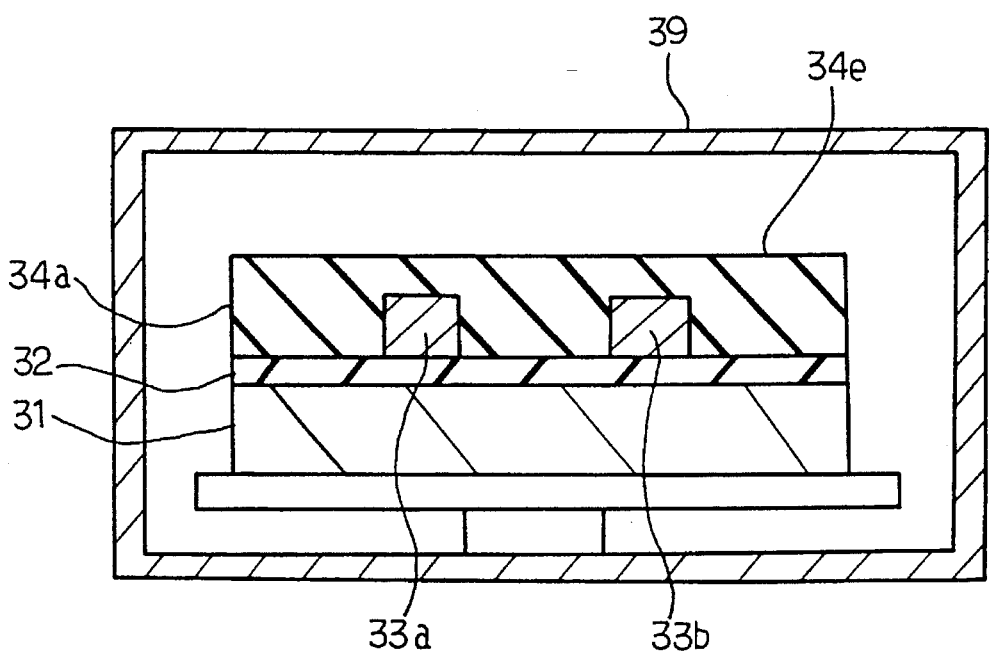

The silicon substrate 31 is placed in a reactor 39 of a parallel plate reactive etching system, and an etch-back is carried out. A selectivity of the reactive ion etching is equal between the silicon oxide and the silicon nitride as similar to the first embodiment, and the inter-level insulating film structure 34 is uniformly etched away until a flat surface 34e is created on the silicon oxide layer 34a as shown in FIG. 3D. The etching conditions achieving the equal selectivity are similar to those of the first embodiment.

Thus, the silicon nitride layer 34b is perfectly removed from the structure, and only the silicon oxide layer 34a is left over the gate electrodes 33a and 33b. The etch-back technique transfers the flat surface 34d to the silicon oxide layer 33a.

Figure 3E:
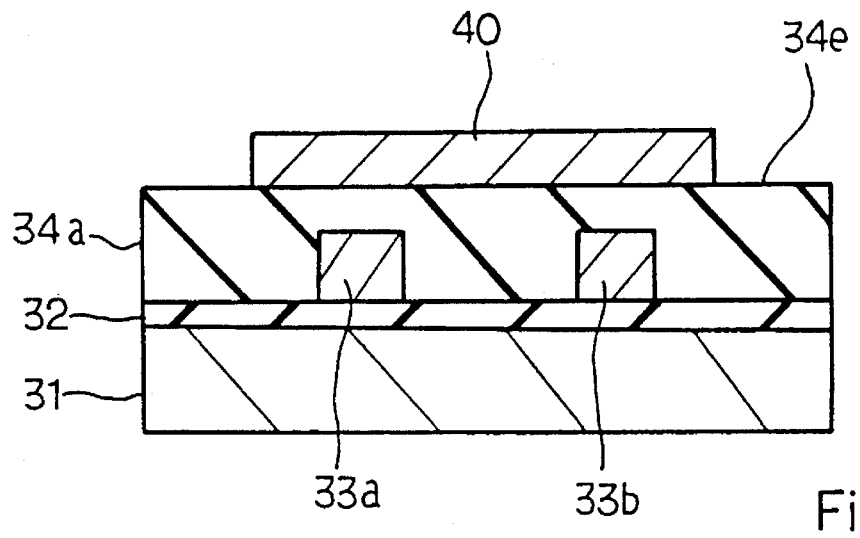

Aluminum is deposited over the entire surface of the structure, and the aluminum layer is patterned into an upper wiring 40 as shown in FIG. 3E. The upper wiring 40 is free from a disconnection due to poor step-coverage, because the silicon oxide layer 34a provides the flat surface 34e. Although the silicon oxide layer 34a between the lower wirings 33a/33b and the upper wiring 40 serves as a dielectric film of a parasitic capacitor, the parasitic capacitance is rather small than that with a silicon nitride layer.

Figure 3F:
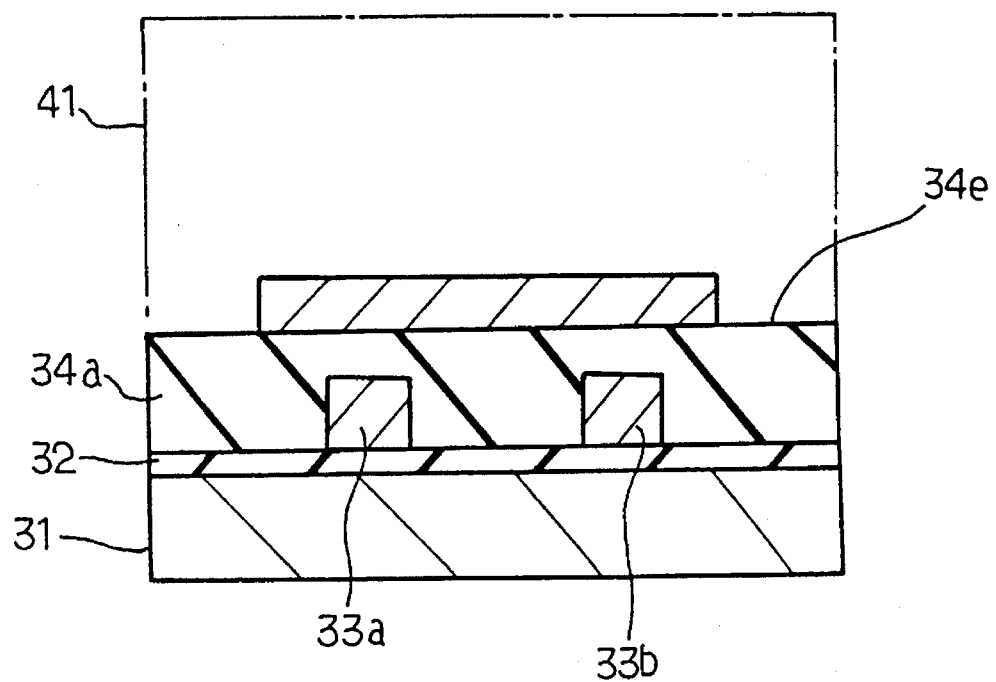

Thus, the depositions, the polishing, the cleaning and the etch-back are repeated so that a multi-level wiring structure 41 is fabricated over the silicon substrate 31 as shown in FIG. 3F.

All of the advantages of the first embodiment are achieved by the process implementing the second embodiment, and the high-speed etch back and the rough time control are further achieved by the second embodiment.

Although particular embodiments of the present invention have been shown and described, it will be obvious to those skilled in the art that various changes and modifications may be made without departing from the spirit and scope of the present invention.

For example, the process according to the present invention is also applicable to a fabrication of a bipolar transistor and a fabrication process of a hi-CMOS transistor.

The lowest wirings may be formed of polysilicon, and the process according to the present invention may be applied to upper-level wirings only.

What is claimed is:

1. A process of fabricating a semiconductor device comprising the steps of:
   a) preparing a semiconductor substrate having an insulating layer formed over said semiconductor substrate;
   b) preparing a conductive layer on said insulating layer by patterning said conductive layer into at least one conductive wiring extending on said insulating layer;
   c) forming a multi-layer insulating film structure having a silicon oxide layer on said at least one conductive wiring and said insulating layer and a silicon nitride layer on said silicon oxide layer;
   d) grinding said multi-layer insulating film structure in such a manner as to leave said silicon nitride layer which is at least 200 nanometers thick in said multi-layer insulating film structure, thereby creating a grinded flat surface of said multi-layer insulating film structure;
   e) cleaning said grinded flat surface with a cleaner corrosive against said conductive layer;
   f) etching said multi-layer insulating film structure under etching conditions having a selectivity equal between silicon oxide and silicon nitride for removing said silicon nitride layer; and
   g) forming upper wirings on an etched surface of said silicon oxide layer.

2. The process as set forth in claim 1, in which said silicon oxide and said silicon nitride are deposited through plasma-assisted chemical vapor deposition techniques in said step c).

3. The process as set forth in claim 1, in which said multi-layer insulating film structure is brought into contact with a rotating cutter for creating said grinded flat surface.

4. The process as set forth in claim 1, in which said multi-layer insulating film structure is retained by a rotating plate member, and is pressed against a rotating polishing pad so as to grind said multi-layer insulating film structure by means of said rotating polishing pad.

5. The process as set forth in claim 1, in which said conductive wiring is formed of aluminum or aluminum alloy.

6. The process as set forth in claim 1, in which a reactive ion etching is used in said step f).

7. The process as set forth in claim 6, in which etching conditions of said reactive ion etching are
   a flow rate between $CHF_3$ and $O_2$ ranging from 2:1 to 10:1,
   a radio frequency power at 1000 watts and
   a pressure of the gaseous mixture of $CHF_3$ and $O_2$ at 10 Pa.

8. The process as set forth in claim 1, in which said silicon oxide layer and said silicon nitride layer each has a convex surface created by said at least one conductive wiring and said multi-layer insulating film structure further has an upper silicon oxide layer covering said silicon nitride layer.

9. The process as set forth in claim 9, in which said grinded flat surface created by the step of grinding includes a portion of said upper silicon oxide layer deposited on said silicon nitride layer.

10. A process of fabricating a semiconductor device, comprising the steps of:
    a) forming wirings over a semiconductor substrate;
    b) successively depositing a silicon oxide layer and a silicon nitride layer over an entire surface so as to cover said wirings by using plasma-assisted chemical vapor deposition techniques;
    c) grinding a surface portion of said silicon nitride layer in such a manner as to leave a silicon nitride sub-layer of 200 nanometers thick for creating a flat surface;
    d) cleaning the flat surface of said silicon nitride sub-layer; and
    e) removing said silicon nitride sub-layer under conditions of a dry etching achieving a selectivity equal between said silicon oxide layer and said silicon nitride sub-layer.

11. A process of fabricating a semiconductor device, comprising the steps of:
    a) forming wirings over a silicon substrate;
    b) successively depositing over said wirings a first silicon oxide layer, a silicon nitride layer at least 300 nanometers thick and a second silicon oxide layer by using plasma-assisted chemical vapor deposition techniques;
    c) mechanically grinding said second silicon oxide layer and said silicon nitride layer by using a chemical slurry, said grinding creating a flat surface and leaving said silicon nitride layer which is at least 200 nanometers on said first silicon oxide layer;
    d) cleaning said flat surface; and
    e) removing said silicon nitride layer under conditions of a dry etching achieving a selectivity equal between said first and second silicon oxide layers and said silicon nitride layer.

* * * * *